(12) United States Patent
Chen et al.

(10) Patent No.: US 10,791,616 B1
(45) Date of Patent: Sep. 29, 2020

(54) RADIATION SOURCE APPARATUS

(71) Applicant: TAIWAN SEMICONDUCTOR MANUFACTURING CO., LTD., Hsinchu (TW)

(72) Inventors: Ssu-Yu Chen, New Taipei (TW); Chi Yang, Taichung (TW); Che-Chang Hsu, Taichung (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/365,905

(22) Filed: Mar. 27, 2019

(51) Int. Cl.
*H05G 2/00* (2006.01)
*G03F 1/58* (2012.01)
*G03F 7/20* (2006.01)
*G03F 1/24* (2012.01)

(52) U.S. Cl.
CPC .............. *H05G 2/008* (2013.01); *G03F 1/24* (2013.01); *G03F 1/58* (2013.01); *G03F 7/7015* (2013.01); *G03F 7/70033* (2013.01); *H05G 2/006* (2013.01)

(58) Field of Classification Search
CPC .......... H05G 2/00; H05G 2/001; H05G 2/003; H05G 2/005; H05G 2/006; H05G 2/008; G03F 1/24; G03F 1/58; G03F 7/70033; G03F 7/015; G03F 7/7015
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 4/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2004/0108473 A1* | 6/2004 | Melnychuk | B82Y 10/00 250/504 R |
| 2006/0012761 A1* | 1/2006 | Bakker | G03F 7/70916 355/30 |

(Continued)

*Primary Examiner* — David E Smith
(74) *Attorney, Agent, or Firm* — McClure, Qualey & Rodack, LLP

(57) ABSTRACT

A radiation source apparatus includes a vessel, a laser, a collector, a container, and a cone structure. The vessel has an exit aperture. The laser is at one end of the vessel and configured to excite a target material to form a plasma. The collector is in the vessel and configured to collect at least radiation of a desired wavelength emitted by the plasma and to direct the collected radiation to the exit aperture of the vessel. The container is configured to receive a residue of the plasma. The cone structure is between the collector and the exit aperture and located besides the container. The cone structure includes a first inner sidewall, and a second inner sidewall adjoining the first inner sidewall and closer to the container than the first inner sidewall, and a first baffle assembly on the first inner sidewall.

20 Claims, 5 Drawing Sheets

(56) References Cited

U.S. PATENT DOCUMENTS

| | | | |
|---|---|---|---|
| 2009/0224181 A1* | 9/2009 | Abe | G03F 7/70033 250/504 R |
| 2014/0217311 A1* | 8/2014 | Nishisaka | H05G 2/008 250/504 R |
| 2015/0338753 A1* | 11/2015 | Riepen | G03F 7/70008 250/504 R |
| 2016/0147160 A1* | 5/2016 | Franken | G03F 7/70033 355/67 |
| 2016/0252821 A1* | 9/2016 | De Jong | G03F 7/70175 355/71 |

* cited by examiner

RADIATION SOURCE APPARATUS

BACKGROUND

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light, is a promising next-generation lithography solution for emerging technology nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
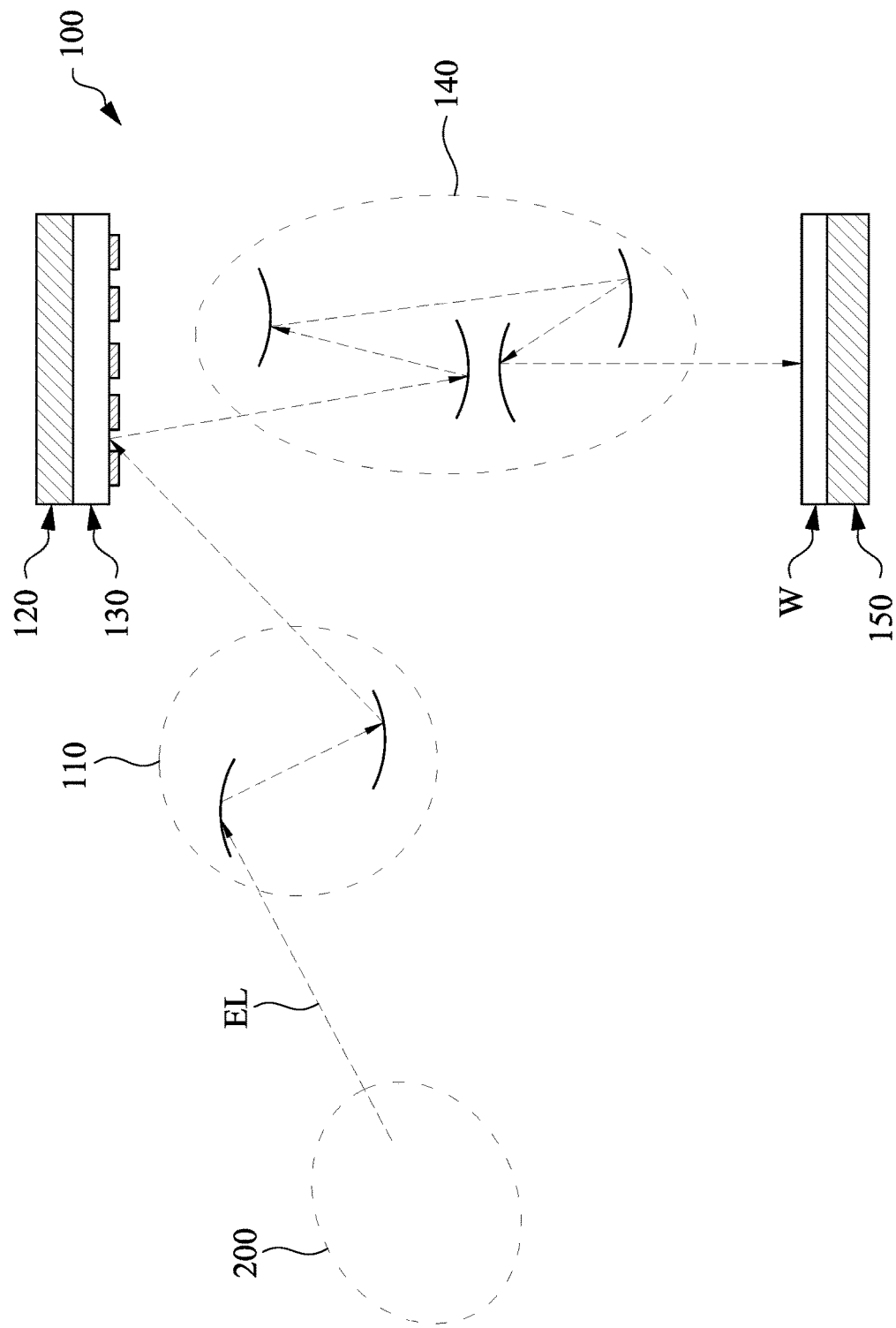
FIG. 1 is a schematic view of a lithography system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

An extreme ultraviolet (EUV) photolithography system uses extreme ultraviolet radiation having a wavelength between about 10 nm and about 130 nm. One method of producing the extreme ultraviolet radiation is to fire a carbon dioxide (CO2) laser at droplets of tin (Sn). The tin droplets are dropped into an EUV source vessel. As the droplets fall into the EUV source vessel, the $CO_2$ laser hits the tin droplets and heats the tin droplets to a critical temperature that causes atoms of tin to shed their electrons and become a plasma of ionized tin droplets. The ionized tin droplets emit photons having a wavelength between about 1 nm and about 100 nm, which is provided as EUV radiation to an optical lithography system.

FIG. 1 is a schematic view of a lithography system 100 according to some embodiments of the present disclosure. The lithography system 100 may also be referred to as a scanner that is operable to perform lithography exposing processes with respective radiation source and exposure mode. In some embodiments, the lithography system 100 is an extreme ultraviolet (EUV) lithography system designed to expose a resist layer by EUV light (or EUV radiation). The resist layer is a material sensitive to the EUV light. The EUV lithography system 100 employs a radiation source 200 to generate EUV light EL, such as EUV light having a wavelength ranging between about 1 nm and about 100 nm. In certain examples, the EUV light EL has a wavelength range centered at about 13.5 nm. Accordingly, the radiation source 200 is also referred to as an EUV radiation source 200. The EUV radiation source 200 may utilize a mechanism of laser-produced plasma (LPP) to generate the EUV radiation, which will be further described later.

The lithography system 100 also employs an illuminator 110. In some embodiments, the illuminator 110 includes various reflective optics such as a single mirror or a mirror system having multiple mirrors in order to direct the EUV light EL from the radiation source 200 onto a mask stage 120, particularly to a mask 130 secured on the mask stage 120.

The lithography system 100 also includes the mask stage 120 configured to secure the mask 130. In some embodiments, the mask stage 120 includes an electrostatic chuck (e-chuck) used to secure the mask 130. In this context, the terms mask, photomask, and reticle are used interchangeably. In the present embodiments, the lithography system 100 is an EUV lithography system, and the mask 130 is a reflective mask. One exemplary structure of the mask 130 includes a substrate with a low thermal expansion material (LTEM). For example, the LTEM may include $TiO_2$ doped SiO2, or other suitable materials with low thermal expansion. The mask 130 includes a reflective multi-layer deposited on the substrate. The reflective multi-layer includes plural film pairs, such as molybdenum-silicon (Mo/Si) film pairs (e.g., a layer of molybdenum above or below a layer of silicon in each film pair). Alternatively, the reflective multi-layer may include molybdenum-beryllium (Mo/Be) film pairs, or other suitable materials that are configurable to highly reflect the EUV light EL. The mask 130 may further include a capping layer, such as ruthenium (Ru), disposed on the reflective multi-layer for protection. The mask 18 further includes an absorption layer, such as a tantalum boron nitride (TaBN) layer, deposited over the reflective multilayer. The absorption layer is patterned to define a layer of an integrated circuit (IC). The mask 130 may have other structures or configurations in various embodiments.

The lithography system 100 also includes a projection optics module (or projection optics box (POB)) 140 for imaging the pattern of the mask 130 onto a semiconductor substrate W secured on a substrate stage (or wafer stage) 150 of the lithography system 100. The POB 140 includes reflective optics in the present embodiments. The light EL that is directed from the mask 130 and carries the image of the pattern defined on the mask 130 is collected by the POB 140. The illuminator 110 and the POB 140 may be collectively referred to as an optical module of the lithography system 100.

In the present embodiments, the semiconductor substrate W is a semiconductor wafer, such as a silicon wafer or other type of wafer to be patterned. The semiconductor substrate W is coated with a resist layer sensitive to the EUV light EL in the present embodiments. Various components including those described above are integrated together and are operable to perform lithography exposing processes.

Figure 2A:
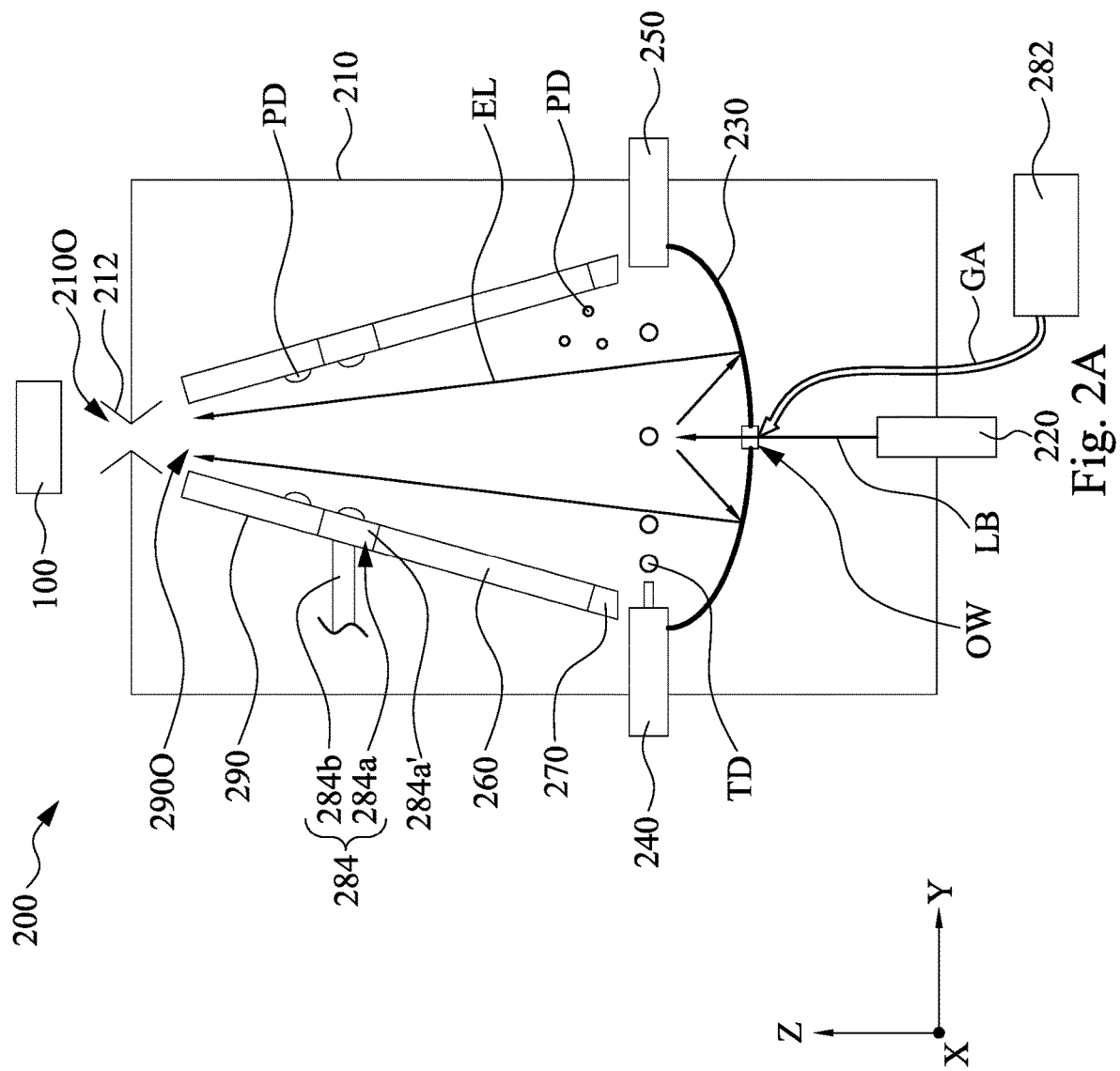
FIGS. 2A and 2B are schematic views of an EUV radiation source viewed form its different sides according to some embodiments of the present disclosure.
Figure 2B:
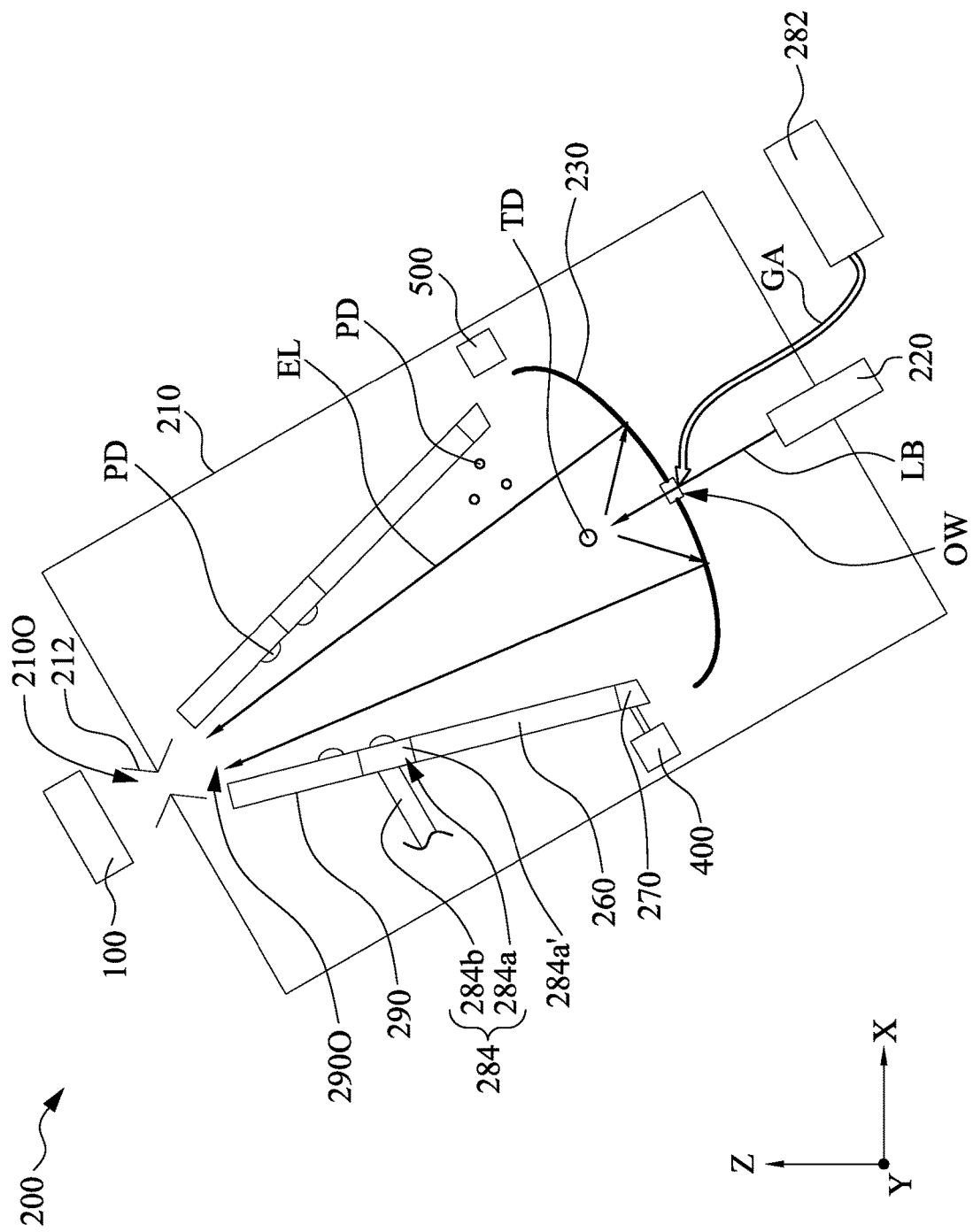

FIGS. 2A and 2B are schematic views of an EUV radiation source 200 viewed form its different sides according to some embodiments of the present disclosure. For example, the EUV radiation source 200 is viewed in X-direction in FIG. 2A, and viewed in Y-direction substantially orthogonal to X-direction in FIG. 2B. The EUV radiation source 200 employs a laser produced plasma (LPP) mechanism to generate plasma and further generate EUV light from the plasma. The radiation source 200 includes a vessel 210, a laser source 220, a collector 230, a target droplet generator 240, a droplet catcher 250, a cover 260, a gutter structure 270, a gas supply module 282, a gas exhaust module 284, and a cone structure 290. The space in the vessel 210 is closed and maintained in a vacuum environment since the air absorbs the EUV radiation.

The target droplet generator 240 delivers a target material TD into the space in the vessel 210 of the radiation source 200, in which the target material TD may be delivered in the form of liquid droplets, a liquid stream, solid particles or clusters, solid particles contained within liquid droplets or solid particles contained within a liquid stream. The target material TD can include suitable fuel material that has a radiation in the EUV range when being converted to a plasma state. For example, the target material TD may include water, tin, lithium, xenon, or the like. In some embodiments, the element tin can be pure tin (Sn); a tin compound, for example, $SnBr_4$, $SnBr_2$, $SnH_4$; a tin alloy, for example, tin-gallium alloys, tin-indium alloys, tin-indium-gallium alloys, or any other suitable tin-containing material.

The laser source 220 is disposed at one end of the vessel 210. The laser source 220 may include a carbon dioxide ($CO_2$) laser source, a neodymium-doped yttrium aluminum garnet (Nd:YAG) laser source, or another suitable laser source to generate a laser beam LB. The laser beam LB is directed through an output window OW integrated with the collector 230. The output window OW adopts a suitable material that is substantially transparent to the laser beam LB. The laser beam LB is directed to heating the target material TD, such as tin droplets, thereby generating high-temperature plasma which further produces the EUV light EL. The pulses of the laser source 220 and the droplet generating rate of the droplet generator 240 are controlled to be synchronized, such that the target material TD receives peak power consistently from the laser pulses of the laser source 220. In some embodiments, the radiation source 200 may employ a dual LPP mechanism in which the laser source 220 is a cluster of multiple laser sources. For example, the laser source 220 may include a pre-heat laser source and a main laser source, which produce pre-heat laser beam and main laser beam, respectively. Each of the pre-heat laser source and the main laser source may be a $CO_2$ laser source, an Nd:YAG laser source, or another suitable laser source. The pre-heat laser beam has a smaller spot size and less intensity than the main laser beam, and is used for pre-heating the target material TD to create a low-density target plume, which is subsequently reheated by the main laser beam, generating increased emission of EUV light EL.

The EUV light EL is collected by the collector 230 disposed in the vessel 210. The collector 230 further reflects and focuses the EUV light EL for the lithography exposure processes. The collector 230 is designed with suitable coating material and shape, functioning as a mirror for EUV collection, reflection, and focus. In some examples, the collector 230 is designed to have an ellipsoidal geometry. In some examples, the coating material of the collector 230 is similar to the reflective multilayer of the EUV mask 130 (referring to FIG. 1). In some examples, the coating material of the collector 230 includes a reflective multi-layer (such as a plurality of Mo/Si film pairs) and may further include a capping layer (such as Ru) coated on the reflective multi-layer to substantially reflect the EUV light. In some examples, the collector 230 may further include a grating structure designed to effectively scatter the laser beam directed onto the collector 230. For example, a silicon nitride layer may be coated on the collector 230 and patterned to have a grating structure.

In some embodiments, the laser beam LB may or may not hit every droplet of the target material TD. For example, some droplets of the target material TD may be purposely missed by the laser beam LB. In the present embodiments, the droplet catcher 250 is installed opposite the target droplet generator 240 and in the direction of the movement of the droplet of the target material TD. The droplet catcher 250 is configured to catch any droplets of the target material TD that are missed by the laser beam LB.

The radiation source 200 may further include an intermediate focus (IF) unit 212 included within an exit aperture 2100 of the EUV source vessel 210, in which the intermediate focus unit 212 is configured to provide intermediate focus to the EUV radiation EL. The collector 230 focuses the EUV light EL generated by the plasma toward the intermediate focus unit 212. The intermediate focus unit 212 is located between the EUV source vessel 210 and the scanner (i.e., the lithography system 100) including optical elements configured to direct the EUV light EL to a workpiece (e.g., a semiconductor substrate). In some embodiments, the intermediate focus unit 212 may comprise a cone shaped aperture configured to provide for separation of pressures between the EUV source vessel 210 and the scanner (i.e., the lithography system 100). In some embodiments, the intermediate focus unit 212 may extend into the scanner (i.e., the lithography system 100).

In some embodiments, the high-temperature plasma may cool down and become vapors or small particles, which may be collectively referred to as debris PD. The debris PD may deposit onto the surface of the collector 230, thereby causing contamination thereon. Over time, the reflectivity of the collector 230 degrades due to debris accumulation and other factors such as ion damages, oxidation, and blistering. Once the reflectivity is degraded to a certain degree, the collector 230 reaches the end of its usable lifetime and may need to be replaced.

Figure 2C:
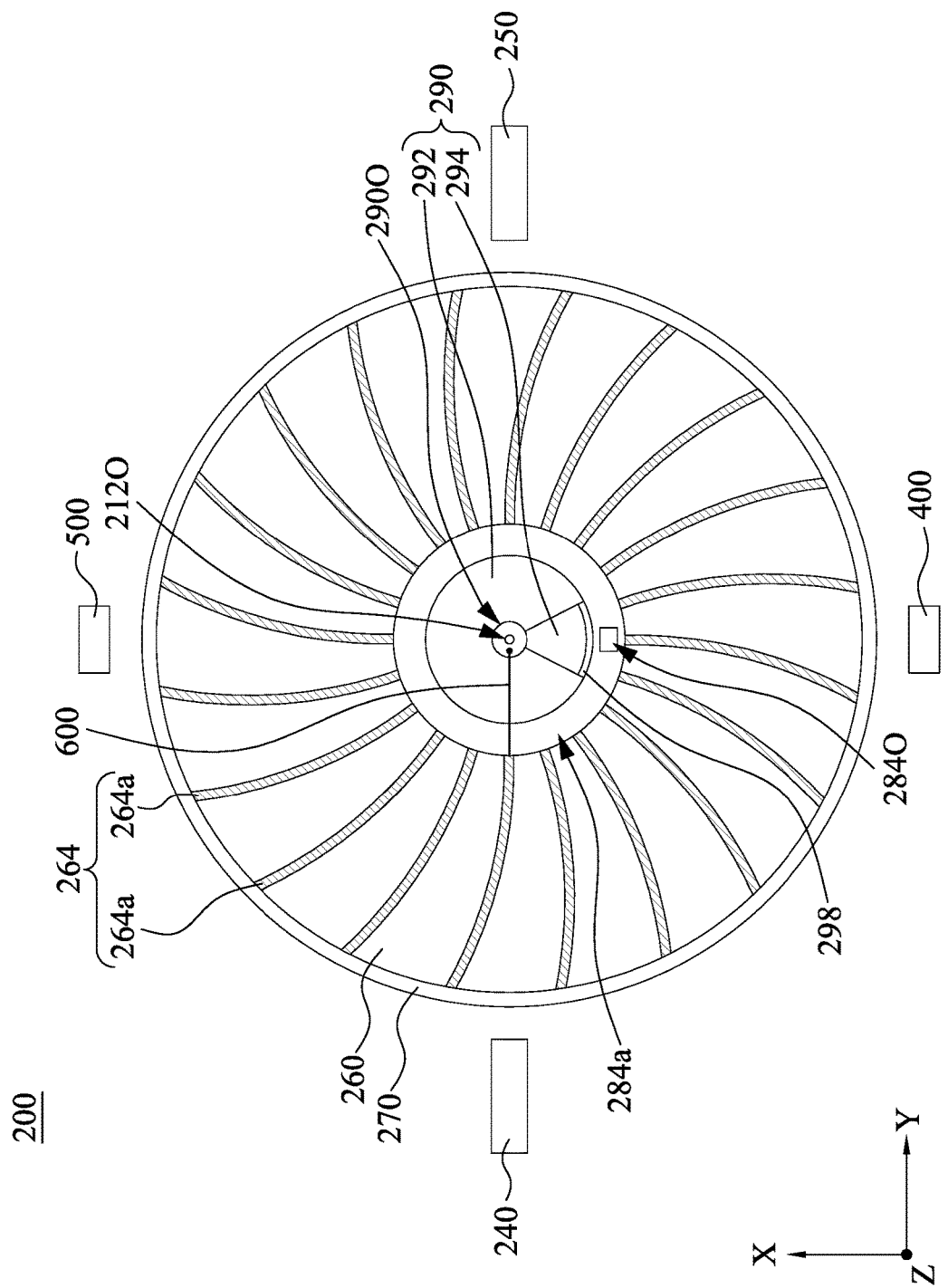
FIG. 2C is a schematic bottom view of the EUV radiation source of FIGS. 2A and 2B.

The cover 260 surrounds the vessel 210 for ventilation and for collecting debris PD. In some embodiments, the cover 260 is made of a suitable solid material, such as stainless steel. The cover 260 is designed and disposed around the collector 230. The cover 260 may include a baffle assembly, such as plural vanes, which is illustrated in FIG. 2C. When the debris PD vapor comes in contact with the cover 260 (e.g., the baffle assembly), it may condense into a liquid form and flow into a lower section of the cover 260 due to gravity. The lower section of the cover 260 may provide holes (not shown) for draining the liquid debris PD out of the cover 260. For example, the lower section of the cover 260 may be connected to the gutter structure 270 which may be connected to a fuel container 400 (referring to FIG. 2B). Through this configuration, the liquid debris PD flows along and/or within the cover 260 (e.g., the baffle assembly) and is received in the gutter structure 270, from which it flows into the fuel container 400 (referring to FIG. 2B). In some embodiments, the radiation source 200 further includes a heating unit disposed around a portion of the cover 260. The heating unit functions to maintain the temperature inside the cover 260 above a melting point of the debris PD, thereby preventing the debris PD to be solidified on the inner surface of the cover 260.

In some embodiments, the radiation source 200 further includes various pipelines for integrating the gas supply module 282 with the collector 230. The gas supply module 282 is configured to provide gas GA into the vessel 210 and particularly into a space proximate to the reflective surface of the collector 230. In some embodiments, the gas GA is hydrogen gas, which has less absorption to the EUV radiation. When the target material TD contains tin, hydrogen gas GA reaching to the coating surface of the collector 230 (and the output window OW as well) reacts chemically with tin to form stannane ($SnH_4$), a gaseous byproduct of the EUV generation process itself. Stannane is then pumped out and discarded. The gas GA is provided for various protection functions, which include effectively protecting the collector 230 from the contaminations by tin particles. Other suitable gas may be alternatively or additionally used. The gas GA may be introduced into the collector 230 through openings (or gaps) near the output window OW through one or more gas pipelines. In some embodiments, the debris PD includes such byproducts between the residues of the target material TD and the gas GA. In some embodiments, the cover 260 and the collector 230 has a certain gap therebetween, and the gap also functions as a gas flow path for providing gas GA into the collector 230 and the cover 260. In some embodiments, the cone structure 290 has an opening 2900 allowing the EUV light EL to pass through itself at its narrow top section, and in some embodiments, the gas GA may be introduced from the opening 2900 of the cone structure 290.

The gas GA may also function to carry the debris PD away from the collector 230 and the cover 260 and into the gas exhaust module 284. In some embodiments, the gas exhaust module 284 includes a gas outlet structure 284a connected to one or more pumps (not shown) through one or more exhaust lines 284b. The pump draws airflow from the cover 260 into the exhaust line 284b for effectively pumping out the debris PD. At this point, the gas GA and the debris PD may be collectively referred to as the exhaust of the radiation source 200. In some embodiments, the cover 260 is designed to have a cone shape with its wide base integrated with the collector 230 and its narrow top section facing the scanner (i.e., the lithography system 100), and the gas exhaust module 284 may be connected to the cover 260 at its narrow top section. Installing the gas exhaust module 284 at the top section of the cover 260 helps the removal of the remaining portion of the debris PD from the space defined by the collector 230 and the cover 260. In some embodiments, the gas exhaust module 284 may include a scrubber 284a' disposed at the entrance of the exhaust line 284b (e.g., adjacent to or on the gas outlet structure 284a) for stopping the debris PD from getting into the exhaust line 284b. That is, the scrubber 284a' may scrub gas vapors or dilute the exiting gas before the gas is released into the surroundings.

FIG. 2C is a schematic bottom view of the EUV radiation source 200 of FIGS. 2A and 2B. Referring to FIGS. 2A-2C, the EUV radiation source 200 may tilt for optically coupling with the scanner (i.e., the lithography system 100). For example, a direction of gravity may be substantially in Z-direction, and the optical axis of the collector 230 and/or the axis of the cone structure 290 is inclined with respect to Z-direction. The tilt of the EUV radiation source 200 results in the fuel container 400 is at a lower position than positions of the target droplet generator 240, the droplet catcher 250, and the droplet position detection system 500, which may also facilitate tin collection. For clear illustration, in the figure, the direction of gravity may be substantially in Z-direction that orthogonal to the X and Y directions, and the optical axis of the collector 230 and/or the axis of the cone structure 290 is inclined with respect to a plane of X and Y directions. For example, an angle between the optical axis of the collector 230, the axis of the cone structure 290, and/or the direction of the laser source 220 and the plane of X and Y directions is in a range from about 55 degrees to about 70 degrees, such that the EUV radiation source 200 may be optically coupling with the scanner.

Referring to FIG. 2C, the cover 260 includes the baffle assembly 264 used to turn the debris PD into a molten form trapped within the vessel 210. The baffle assembly 264 includes a series of passages and structures that receive, slow and capture a portion of the debris PD. The baffle assembly 264 can be formed from a series of vanes 264a or other structures and porous materials that extend from the top end of the cover 260 to the lower end of the cover 260. In some embodiments, the vanes 264a of the baffle assembly 264 extend from the gas exhaust module 284 (e.g., the gas outlet structure 284a in FIG. 2C) to the gutter structure 270, and evenly spaced around the cone-shaped cover 260.

Reference is made to FIGS. 2A-2C, in some embodiments, the cone structure 290 has a cone shape with its wide base integrated with the gas exhaust module 284 and its narrow top section facing the scanner (i.e., the lithography system 100). The cone shape of the cone structure 290 tapers toward the exit aperture 2100 of the vessel 210, just outside of which is located the intermediate focus 212. The cone structure 290 is located besides the container 400, and has some elements arranged according to the position of the container 400.

Referring to FIG. 2C, in some embodiments, the cone structure 290 has a first inner sidewall 292 and a second inner sidewall 294 adjoining the first inner sidewall 292, in which the first inner sidewall 292 and the second inner sidewall 294 surround the opening 2900. The second inner sidewall 294 is adjacent to the fuel container 400, while the first inner sidewall 292 is away from the fuel container 400. That is, the second inner sidewall 294 is located closer to the container 400 than the first inner sidewall 292 is. In some embodiments, the first inner sidewall 292 and the second inner sidewall 294 includes suitable opaque material having low reflectance at the spectrum of the laser source 220 (i.e., IR spectrum, referring to FIGS. 2A and 2B) and suitable absorptance at the spectrum of the laser source 220. The reflectance of the first inner sidewall 292 and the second inner sidewall 294 may be in a range of about 0% to about 40%, for example, in a range of about 0% to about 20%. For example, the material of the first and second inner sidewalls 292 and 294 is, ceramics, molybdenum, or the like. A ceramic material is an inorganic, non-metallic, such as crystalline oxide, nitride or carbide material. Some elements, such as carbon or silicon, may be considered ceramics. In some other embodiments, the first and second inner sidewalls 292 and 294 may be coated with an anti-glint layer or other layers made of aforementioned materials (e.g., ceramics or molybdenum) having low reflectance. The thickness of the anti-glint layer may be in a range of about 1 micrometer to about 1000 micrometers. In some embodiments, the materials of the first inner sidewall 292 and the second inner sidewall 294 (e.g., ceramics or molybdenum) are chosen to have a high melting point to withstand the environment of the radiation source device. In some embodiments, the materials of the first inner sidewall 292 and the second inner sidewall 294 (e.g., ceramics or molybdenum) have suitable thermal conductivity to transfer heats converted from the absorptance of IR spectrum. The detail of the cone structure 290 will be illustrated later.

The EUV radiation source 200 may further include a droplet position detection system 500 which may include one or more droplet imagers that provide an output indicative of the position of one or more droplets. The droplet position detection system 500 may include a camera metrology frame (CMF) for holding the imagers. The imager(s) may provide this output to a droplet position detection feedback system, which can, e.g., compute a droplet position and trajectory, from which a droplet error can be computed, e.g., on a droplet by droplet basis or on average. The droplet error may then be provided as an input to the controller, which can, for example, provide a position, direction and/or timing correction signal to the system to control a source timing circuit and/or to control a beam position and shaping system, e.g., to change the location and/or focal power of the light pulses. Also, for the EUV light source 200, the droplet generator 240 may have a control system operable in response to a signal (which in some implementations may include the droplet error described above, or some quantity derived therefrom) from the controller, to e.g., modify the release point, release timing and/or droplet modulation to correct for errors in the droplets arriving at the desired irradiation region. The radiation source 200 may further include other components. For example, the radiation source 200 may include a central obscuration bar 600 designed and configured to obscure the laser beam LB. The central obscuration bar 600 may has an end fixed to a lower side of the cone structure 290.

Figure 3:
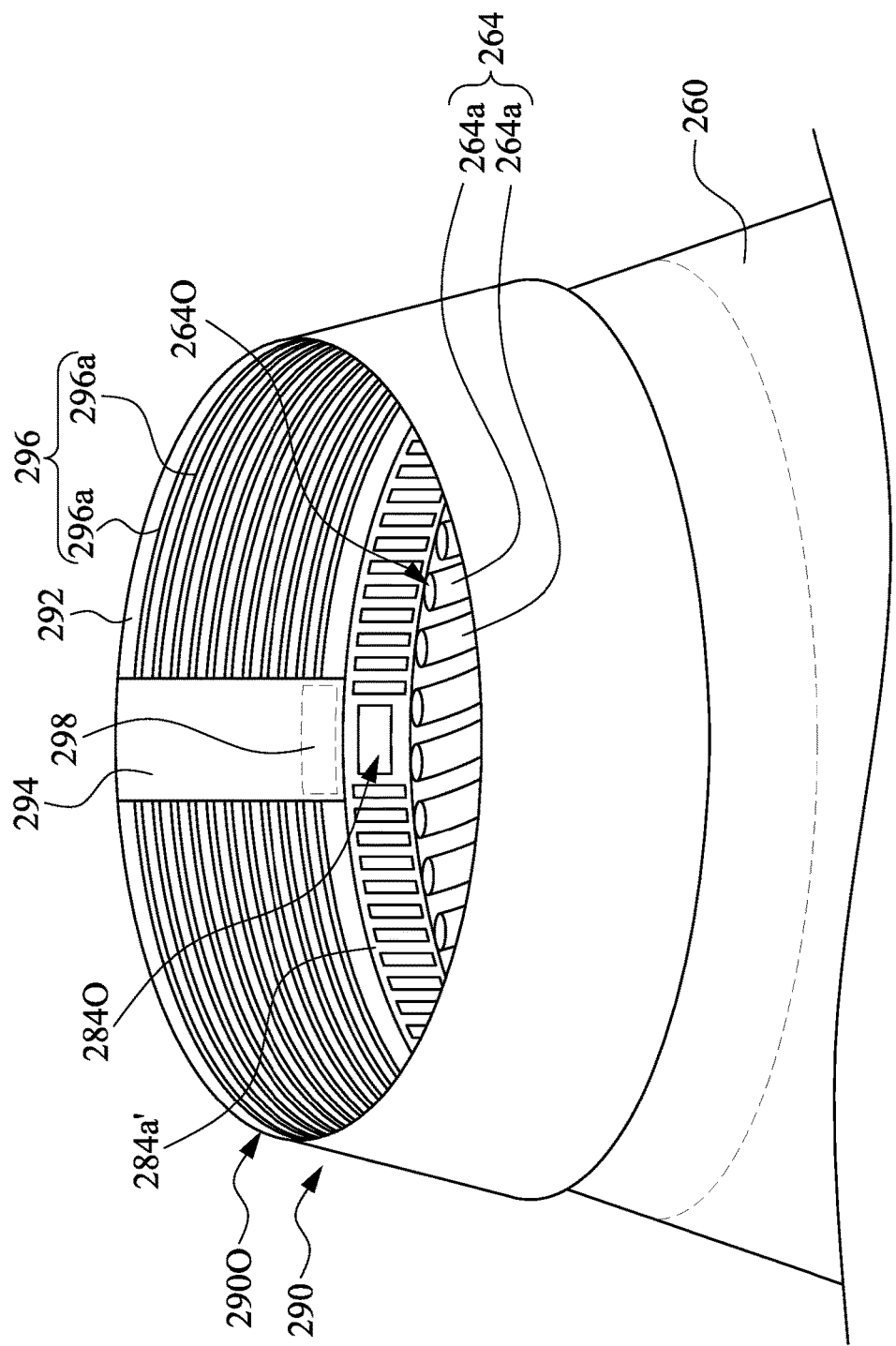
FIG. 3 is a perspective schematic view of a cone structure of an EUV radiation source according to some embodiments of the present disclosure.

FIG. 3 is a perspective schematic view of the cone structure 290 of an EUV radiation source according to some embodiments of the present disclosure. Referring to FIG. 2C and FIG. 3, the cone structure 290 may include a baffle assembly 296 to turn the debris PD into a molten form trapped within the vessel 210 (referring to FIGS. 2A-2B). The baffle assembly 296 may be disposed on the first inner sidewall 292 of the cone structure 290, but not on the second inner sidewall 294 adjacent to the container 400 (referring to FIG. 2C). The baffle assembly 296 includes a series of passages and structures that receive, slow and capture a portion of the debris PD (referring to FIGS. 2A-2B). The baffle assembly 296 can be formed from a series of vanes 296a or other structures and porous materials. In some embodiments, the vanes 296a may extend from a first edge of the second inner sidewall 294 to a second edge of the second inner sidewall 294. Surfaces of the baffle assembly 296 (e.g., surfaces of the vanes 296a) may be coated with an anti-glint layer having low reflectance at the spectrum of the laser source 220 (e.g., IR spectrum) and suitable absorptance at the spectrum of the laser source 220. For example, the anti-glint coating layer on the surfaces of the baffle assembly 296 (e.g., vanes 296a) may be made of ceramics, or other suitable opaque materials. In some embodiments, the baffle assembly 296 may have molybdenum surfaces. The reflectance of the coating layer on the surfaces of the baffle assembly 296 may be in a range of about 0% to about 40%, for example, in a range of about 0% to about 20%. The thickness of the anti-glint layer may be in a range of about 1 micrometer to about 1000 micrometers. In some embodiments, the coating layer on the surfaces of the baffle assembly 296 (e.g., ceramics or molybdenum) have suitable thermal conductivity to transfer heats converted from the absorptance of IR spectrum.

By designing the sidewalls 292 and 294 and the baffle assembly 296 of the cone structure 290 to have low reflectance material, the cone structure 290 is prevented from locally heated by the reflection of the laser beam LB (referring to FIGS. 2A and 2B), which in turn will prevent the debris PD (referring to FIGS. 2A and 2B) accumulating on the cone structure 290 from flowing fast and falling onto the collector 230 due to its low viscosity at high temperature.

Referring to FIGS. 2B and 3, under the influence of gravity, liquid debris PD may flow along the vanes 296a of the baffle assembly 296, from the first inner sidewall 292 to the second inner sidewall 294. In some embodiments, the scrubber 284a' has a drain hole 2840 adjacent to the lower side of the second inner sidewall 294, and the liquid debris PD on the second inner sidewall 294 may then flow to the cover 260 through the drain hole 2840 of the scrubber 284a'. Subsequently, the liquid debris PD may flow through the vanes 264a of the baffle assembly 264 of the cover 260 to the gutter structure 270, and received by the fuel container 400. In some embodiments, some vanes 264a of the baffle assembly 264 may have drain holes 2640 at their respective top ends, such that liquid debris PD may flow through the drain hole 2840 of the scrubber 284a' into the drain holes 2640 of the vanes 264a, toward the fuel container 400.

In some embodiments, the cone structure 290 includes a heater 298, which is adjacent to the second inner sidewall 294, but not adjacent to the first inner sidewall 292. For example, the heater 298 may be embedded in the lower portion of the second inner sidewall 294. A suitable type of the heater 198 includes a radiative heater, a microwave heater, a RF heater, an ohmic heater, or a combination of thereof. The heat generated by the heater 298 can be directed to a specific surface, and thus be directional. For example, the heater 298 is configured to heat the lower portion of the second inner sidewall 294, and may not directly heat an upper portion of the second inner sidewall 294 and the first inner sidewall 292. The directional heating may accelerate the flow of the liquid debris PD on the lower portion of the second inner sidewall 294, and keep the liquid debris PD on a higher portion of the second inner sidewall 294 or the first inner sidewall 292 flowing relatively slowly, thereby preventing the liquid debris PD from flowing fast and falling onto the collector 230.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that inner sidewalls of the cone structure are designed to have low reflectance, thereby reducing laser reflection, and achieving uniform temperature distribution in the cone structure, which in turn will prevent a liquid material from flowing fast and falling onto the collector due to its low viscosity at high temperature. Still another advantage is that a baffle assembly is added to the cone structure for guiding the liquid material to flow smoothly and preventing the liquid material from falling onto the collector. In some embodiments, a surface of the baffle assembly has low reflectance, thereby reducing laser reflection, and achieving uniform temperature distribution in the cone structure. Still another advantage is that the cone structure may have a heater at a side adjacent to the fuel container, thereby accelerating the flow of liquid material.

According to some embodiments of the present disclosure, a radiation source apparatus includes a vessel, a laser, a collector, a container, and a cone structure. The vessel has an exit aperture. The laser is disposed at one end of the vessel and configured to excite a target material to form a plasma. The collector is disposed in the vessel and configured to collect at least radiation of a desired wavelength emitted by the plasma and to direct the collected radiation to the exit aperture of the vessel. The container is configured to receive a residue of the plasma. The cone structure is between the collector and the exit aperture and located besides the container. The cone structure includes a first inner sidewall, and a second inner sidewall adjoining the first inner sidewall, and a first baffle assembly. The second inner sidewall is located closer to the container than the first inner sidewall is. The first baffle assembly is disposed on the first inner sidewall.

According to some embodiments of the present disclosure, a radiation source apparatus includes a vessel, a laser, a collector, and a cone structure. The vessel has an exit aperture. The laser is disposed at one end of the vessel and configured to excite a target material to form a plasma. The collector is disposed in the vessel and configured to collect at least radiation of a desired wavelength emitted by the plasma and to direct the collected radiation to the exit aperture of the vessel. The cone structure is between the collector and the exit aperture. The cone structure has an opening for passing the collected radiation. The cone structure includes a first inner sidewall, a second inner sidewall adjoining the first inner sidewall, and a heater. The first inner sidewall and the second inner sidewall surround the opening of the cone structure. The heater is closer to the second inner sidewall than to the first inner sidewall.

According to some embodiments of the present disclosure, a radiation source apparatus includes a vessel, a laser, a collector, and a cone structure. The vessel has an exit aperture. The laser is disposed at one end of the vessel and configured to excite a target material to form a plasma. The collector is disposed in the vessel and configured to collect at least radiation of a desired wavelength emitted by the plasma and to direct the collected radiation to the exit aperture of the vessel. The cone structure is between the collector and the exit aperture. The cone structure has an opening for passing the collected radiation. The cone structure includes a first inner sidewall, a second inner sidewall adjoining the first inner sidewall, and a baffle assembly. The first inner sidewall and the second inner sidewall surround the opening of the cone structure. The baffle assembly is on the first inner sidewall, and the baffle assembly is not on the second inner sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A radiation source apparatus, comprising:
   a vessel having an exit aperture;
   a laser disposed at one end of the vessel and configured to excite a target material to form a plasma;
   a collector disposed in the vessel and configured to collect at least radiation of a desired wavelength emitted by the plasma and to direct the collected radiation to the exit aperture of the vessel;
   a container configured to receive a residue of the plasma; and
   a cone structure between the collector and the exit aperture, wherein the cone structure is located besides the container and comprises:
   a first inner sidewall and a second inner sidewall adjoining the first inner sidewall, wherein the second inner sidewall is located closer to the container than the first inner sidewall is; and
   a first baffle assembly disposed on the first inner sidewall, wherein the first baffle assembly comprises a plurality of vanes extending from a first edge of the second inner sidewall of the cone structure to a second edge of the second inner sidewall of the cone structure.

2. The radiation source apparatus of claim 1, wherein the first baffle assembly is not disposed on the second inner sidewall of the cone structure.

3. The radiation source apparatus of claim 1, wherein the cone structure further comprises a heater configured to heat the second inner sidewall of the cone structure.

4. The radiation source apparatus of claim 1, wherein the second inner sidewall has a ceramic surface layer.

5. The radiation source apparatus of claim 1, further comprising:
   a gas outlet structure disposed between the collector and the cone structure.

6. The radiation source apparatus of claim 5, further comprising:
   a scrubber disposed adjacent to or on the gas outlet structure, wherein the scrubber has a drain hole adjacent to the second inner sidewall of the cone structure.

7. The radiation source apparatus of claim 1, further comprising:
   a second baffle assembly disposed between the collector and the cone structure, wherein the container is connected with the second baffle assembly.

8. A radiation source apparatus, comprising:
   a vessel having an exit aperture;
   a laser disposed at one end of the vessel and configured to excite a target material to form a plasma;

a collector disposed in the vessel and configured to collect at least radiation of a desired wavelength emitted by the plasma and to direct the collected radiation to the exit aperture of the vessel; and a cone structure between the collector and the exit aperture, wherein the cone structure has an opening for passing the collected radiation, and the cone structure comprises:

a first inner sidewall and a second inner sidewall adjoining the first inner sidewall, wherein the first inner sidewall and the second inner sidewall surround the opening of the cone structure;

a heater closer to the second inner sidewall than to the first inner sidewall; and a scrubber disposed between the collector and the cone structure, wherein the scrubber is connected with the first inner sidewall and the second inner sidewall of the cone structure.

9. The radiation source apparatus of claim 8, wherein the heater is adjacent to a lower portion of the second inner sidewall of the cone structure.

10. The radiation source apparatus of claim 8, further comprising:

a container configured to receive a residue of the plasma, wherein the cone structure is located besides the container, and the second inner sidewall of the cone structure is closer to the container than the first inner sidewall of the cone structure.

11. The radiation source apparatus of claim 8, further comprising:

a gas outlet structure disposed between the collector and the cone structure.

12. The radiation source apparatus of claim 8, wherein the cone structure tapers toward the exit aperture of the vessel.

13. The radiation source apparatus of claim 8, wherein the second baffle assembly comprises at least one vane fluidly connected with the container.

14. A radiation source apparatus, comprising:

a vessel having an exit aperture;

a laser disposed at one end of the vessel and configured to excite a target material to form a plasma;

a collector disposed in the vessel and configured to collect at least radiation of a desired wavelength emitted by the plasma and to direct the collected radiation to the exit aperture of the vessel; and a cone structure between the collector and the exit aperture, wherein the cone structure has an opening for passing the collected radiation, and the cone structure comprises:

a first inner sidewall and a second inner sidewall adjoining the first inner sidewall, wherein the first inner sidewall and the second inner sidewall surround the opening of the cone structure;

a baffle assembly on the first inner sidewall, wherein the baffle assembly is not on the second inner sidewall; and a container configured to receive a residue of the plasma, wherein the second inner sidewall is closer to the container than the first inner sidewall.

15. The radiation source apparatus of claim 14, wherein the baffle assembly comprises a plurality of vanes, and surfaces of the vanes are coated with a ceramic material.

16. The radiation source apparatus of claim 14, wherein the cone structure further comprises a heater adjacent to the second inner sidewall.

17. The radiation source apparatus of claim 14, further comprising:

a gas outlet structure disposed between the collector and the cone structure.

18. The radiation source apparatus of claim 17, further comprising:

a scrubber connected to the gas outlet structure, wherein the scrubber has a drain hole adjacent to the second inner sidewall of the cone structure.

19. The radiation source apparatus of claim 14, wherein the first inner sidewall extends from a first side of the second inner sidewall and a second side of the second inner sidewall.

20. The radiation source apparatus of claim 14, further comprising:

at least one vane between the collector and the cone structure, wherein the vane is fluidly connected with the container.

* * * * *